United States Patent [19]
Braathen et al.

[11] Patent Number: 4,952,886
[45] Date of Patent: Aug. 28, 1990

[54] RF POWER-CONTROL CIRCUIT

[75] Inventors: Russell Braathen; Ronald Green, both of Calgary, Canada

[73] Assignee: NovAtel Communications Ltd., Calgary, Canada

[21] Appl. No.: 208,411

[22] Filed: Jun. 17, 1988

[51] Int. Cl.$^5$ .......................... H03G 3/30; H03C 1/06
[52] U.S. Cl. ...................................... 330/279; 332/162
[58] Field of Search ............... 330/129, 138, 141, 149, 330/279, 289, 285; 332/37 R, 37 D, 159, 162; 455/108, 126

[56] References Cited

U.S. PATENT DOCUMENTS 4,013,961  3/1977  Coleburn ..................... 455/126 X
4,639,938  1/1987  Kennett ........................ 330/149 X

FOREIGN PATENT DOCUMENTS 0039469  3/1980  Japan .............................. 332/37 D Primary Examiner—Steven Mottola
Attorney, Agent, or Firm—Nutter, McClennen & Fish

[57] ABSTRACT

An improved circuit for controlling the output power level of a radio frequency (RF) amplifier is disclosed. The circuit samples the output of an RF amplifier. The sample is amplitude modulated at a preselected modulation frequency and is passed to a detector. In response to the amplitude modulated signal, the detector produces a signal whose amplitude is indicative of the RF amplifier's output power and whose frequency is the modulation frequency. The amplitude of the signal produced by the detector is then compared to a reference amplitude and the difference (error signal) is used to control the gain of the RF amplifier.

23 Claims, 1 Drawing Sheet

RF POWER-CONTROL CIRCUIT

FIELD OF THE INVENTION

This invention relates generally to the control of the output of an RF amplifier, and more specifically, to a control circuit for accurately regulating the output power over a wide range of temperatures.

DESCRIPTION OF THE PRIOR ART

In certain applications it is desirable to maintain close control of the output power of an RF amplifier. For example, in cellular telephone systems the RF output of each subscriber unit must be controlled within specified tolerances over a temperature range corresponding to tropical conditions at one extreme and arctic conditions at the other.

Control of the output power amplifier is accomplished through a feedback loop. Typically, a portion of the output of the RF amplifier is applied as an input signal for a detector which, in turn, provides a power-indicating signal whose level corresponds to the RF output power. This signal is compared with a reference and the difference between the two is applied to the RF amplifier so as to change the amplifier's gain and minimize the magnitude of the difference.

The detector is typically a semiconductor diode which has a forward voltage drop that is dependent upon temperature. Moreover, the application of RF power to a diode will itself cause the temperature to change and therefore change the forward voltage drop. Consequently, as the temperature varies, the level of the power-indicating signal varies. This, in turn, causes the output of the RF amplifier to change even though the reference is held constant.

There are several methods of avoiding temperature-caused variation in RF output power. One method is to use a second diode whose characteristics match those of the detector diode and which is subjected to the same temperature. This second diode is connected in such a way as to reduce the temperature variations in the signal from the detector diode, an example being described in U.S. Pat. No. 4,523,155. However, the selection of diodes having matching characteristics is a relatively expensive procedure. Moreover, there is a practical limit on the extent to which the characteristics of the diodes can be matched and to which the diodes can be exposed to the same ambient temperature in the presence of thermal gradients caused by other components in the system.

In a case where the transmitter output level can be selectively varied over several orders of magnitude, for example in a cellular telephone, the temperature-variant forward voltage drop of the detector diode may be small compared to the detector input signal level, when high RF output power is being transmitted. The effect of temperature changes on the forward drop will be proportionally small and voltage drop fluctuations will therefore have little effect on the power-indicating signal generated by the detector. Alternatively, when low RF output power is being transmitted the forward voltage drop can be significant when compared with the detector input signal. Temperature variations in the voltage drop will therefore materially change the power-indicating signal.

Another method of coping with temperature variations makes use of this distinction. It compresses the dynamic range of the detector input signal by logarithmically amplifying the signal. By picking an appropriate amplification, the detector input signal can thus be made large compared with voltage drop across the detector diode for all power levels to be transmitted by the unit. Therefore, the temperature-caused variations in the voltage drop will have a small effect on the power indicating signal. An example of this method is described in U.S. Pat. No. 4,602,218. However, this method does not provide as precise control as diode matching.

Another temperature-related problem is the offset in the amplifier that is used to amplify the power-indicating signal. The temperature-related changes in this offset will, uncompensated, also cause undesirable changes in the output amplifier.

SUMMARY OF THE INVENTION

In a circuit embodying the invention, a power amplifier's output is sampled as the RF input to the detector is amplitude modulated at a selected rate. The detector output is thus essentially a lower frequency signal whose amplitude corresponds to the amplitude of the RF signal to the detector and whose frequency is the modulation frequency. The amplitude of the lower frequency signal corresponds to the amplitude of the detector input signal and thus, to the RF amplifier output power. The lower frequency signal amplitude is compared to a reference to provide an error signal which is proportional to the difference between the lower frequency waveform amplitude and the reference. This error signal is then used to control the gain of the RF amplifier.

The amplitude of the lower frequency signal is independent of the quiescent voltage drop across the detector diode. While the amplitude is dependent upon the rectification efficiency of the diode, this effect is only lightly temperature dependent. Thus, the gain of the RF amplifier can be controlled with very little effect from temperature changes.

Switching the detector input signal on and off is a form of amplitude modulation with a square-wave modulation signal and, in fact, it is the preferred modulation arrangement for ease of implementation. However, other amplitude modulation arrangements can be used without departing from the scope of the invention. That is, in any such arrangement the detector rectifies its modulated RF input signal and its output is thus a modulation signal whose amplitude is substantially independent of the detector quiescent voltage drop. It should be noted that the modulation percentage be essentially constant.

The amplitude of the low frequency signal may be determined after amplification. Since the amplitude of the signal is independent of any offset introduced by the amplifier, the temperature effect on the offset is removed.

BRIEF DESCRIPTION OF THE DRAWINGS

This invention is pointed out with particularity in the appended claims. The above and further advantages of this invention ma be better understood by referring to the following description taken in conjunction with the accompanying drawing, the schematic diagram of the circuit constructed in accordance with the invention.

DETAILED DESCRIPTION OF AN ILLUSTRATIVE EMBODIMENT

Figure 1:
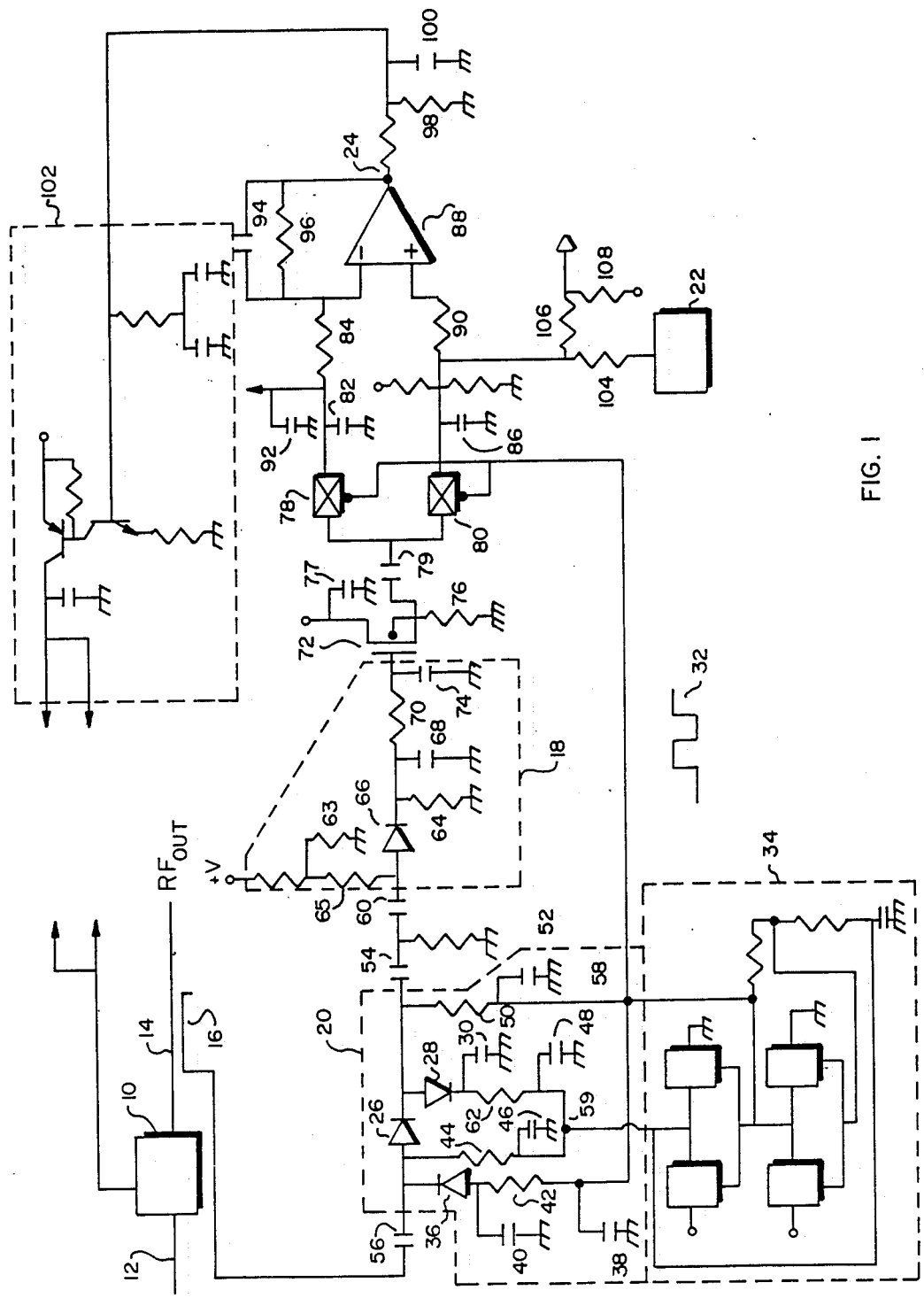

As shown in the drawing a controlled RF amplifier unit incorporating the invention includes a controllable RF amplifier 10 that amplifies an RF signal at an input terminal 12 and provides an output at a terminal 14. A portion of the RF output is extracted by a directional coupler 16 and applied as an input signal to a detector 18 through a switch 20. The output of the detector 18 is compared with a variable reference from a reference source 22 and the resulting difference or error signal at a terminal 24 is applied back to RF amplifier 10 to control the gain thereof.

The switch 20 consists primarily of a set of PIN diodes 26, 28 and 36. The diode 26 is connected in series in the signal path from the coupler 16 to the detector 18, through D.C. blocking capacitors 54, 56 and 60. The diodes 28 and 36 are connected in shunt. To turn the switch 20 on, the diode 26 is turned on and the diodes 28 and 36 are turned off, thus providing a signal conducting path from the directional coupler 16 to the detector 18. To turn off the switch 20, diode 26 is turned off and diodes 28 and 36 are turned on. This breaks the path between the coupler 16 and the detector 18.

The switch 20 is periodically turned on and off in response to a modulation signal 32 produced by a generator 34. This switching signal, which alternates between zero and a positive voltage with respect to ground, is applied to the switching node 58 and, in inverted form, to switching node 59.

More specifically, when the switching signal is positive, node 59 is positive and node 58 is at ground. This causes diode 26 to be forward biased by virtue of the conduction path from node 59 through resistors 44 and 50 to node 59. Diode 36 is reverse biased by virtue of the conduction path from node 59 through resistors 44 and 42 to node 58. Similarly, diode 28 is reverse biased by the conduction path from node 59 through resistors 62 and 50 to node 58.

When the switching signal becomes negative, one-half-cycle later, node 59 is at ground and node 58 is positive. This causes diode 26 to be reverse biased by virtue of the previously described conduction path between nodes 58 and 59 and prevents the detector input signal from reaching the detector 18. At the same time diode 28 is forward biased by virtue of the conduction path from node 58 through resistors 50 and 62 to node 59. With diode 28 forward biased, capacitor 30 acts to cancel the impedance of diode 28 so as to shunt to ground any RF signal which leaks through reverse biased diode 26. Resistor 62 and capacitor 48 act as a filter to prevent any potentials appearing at the junction of diode 28 and capacitor 30 from propagating through the circuit. Similarly, when node 58 is positive diode 36 is forward biased by virtue of the conduction path through resistors 42 and 44 to node 59. Capacitor 40 is present to cancel the impedance of the leads of diode 36 so that any RF signal, present when diode 36 is conducting, is brought to ground. Resistor 42 and capacitor 38 acts as a filter to prevent any potential developed at the junction between diode 36 and capacitor 40 from propagating through the rest of the circuit.

The output of the switch 20 is a square-wave-modulated RF signal whose modulation corresponds to the modulation signal 32. That is, it is a square-wave-modulated RF signal whose frequency is the frequency of the switching signal and whose amplitude is a measure of the power in the RF output signal.

Detector 18 includes a diode 66 that is forward biased by the supply voltage (+v), applied through resistors 63, 65 and 64 to bring the diode into an operating region in which it is capable of detecting small input signals. The signal passed by the diode 66 is filtered by a resistor-capacitor network of capacitors 68 and 74 and resistor 70 to remove its RF content. The resulting signal is substantially a replica of the modulation, level-shifted by the amount of the bias of the diode 66.

This power indicating signal is applied to the base terminal of a FET 72 connected as an amplifier. The output of the FET 72 is applied through a coupling capacitor 79, to remove the DC component, to two gates 78 and 80, which are alternately and oppositely turned on and off by the phase shifted switching signal 32.

When the switching signal supplied by the signal generator 34 is at ground, gate 78 is turned on, allowing the power-indicating signal from the FET 72 to a charge capacitor 82. During this time interval, the switch 20 is on and the power-indicating signal component through the FET 72 is composed of both the portion of the RF output extracted by the coupler 16 and the offset provided by the FET 72. The combination of capacitor 82 and resistor 84 preferably has a long time constant compared to the period of the switching signal from signal generator 34. Therefore, the voltage on capacitor 82 reflects the power-indicating signal voltage applied to it when gate 78 is turned off.

Conversely, when the switching signal 32 is high, gate 80 is turned on, allowing the power-indicating signal from the FET 72 to be applied to capacitor 86. During this interval, the switch 20 is off and the power indicating signal component from the FET 72 is composed essentially of the offset. The output of the difference amplifier 88 is proportional to the difference between the two voltages on its input terminals, i.e. the voltages on capacitors 82 and 86. Each of the voltages has a component which is the offset from the FET 72. The difference between two voltages which is the amplitude of the power-indicating signal, is a component of the output of amplifier 88. Specifically, the offset from the FET 72 has been eliminated. This should be contrasted with prior systems which require DC coupling between the detector and the subsequent amplifier. In those systems, temperature-caused variations in the amplifier offset materially modify the power-indicating signal, whereas, as described above, the signal is isolated from such variations.

The reference voltage from a reference source voltage 22 is applied to a terminal of amplifier 88 so that the output of the amplifier 88 is the difference between the reference voltage and the amplitude of the power-indicating signal. This output is thus an error signal indicating deviation of the RF power from the reference. This error signal is then fed back to the amplifier 10 whose gain is thus adjusted to minimize the error signal.

The foregoing description has been limited to a specific embodiment of this invention. It will be apparent, however, that variations and modifications may be made to the invention, with the attainment of some or all of the advantages of the invention. For example, detection may be accomplished through a device other than a diode, such as a bolometer. Further, synchronous rectification would not be required if the signal were AC amplified and its amplitude measured. Therefore, it is the object of the appended claims to cover all such variations and modifications as come within the true spirit and scope of the invention.

What is claimed as new and desired to be secured by Letters Patent of the United States is:

1. A controllable gain amplifying circuit, said circuit comprising:
   A. a gain-controllable amplifier adapted for reception of an input signal and a control signal, said gain-controllable amplifier amplifying said input signal to generate an output signal;
   B. means for extracting a portion of said output signal;
   C. means for amplitude modulating said extracted portion with a modulation signal to generate a modulated signal;
   D. a detector connected to receiver the modulation signal from the modulated signal;
   E. means for comparing the amplitude of the recovered modulation signal with a reference to generate an error signal; and
   F. means for controlling the gain of said gain-controllable amplifier in response to said error signal.

2. An amplifying circuit as in claim 1 wherein said means for amplitude modulating comprises a switch.

3. An amplifying circuit as in claim 2 wherein said switch comprises:
   A. a first PIN diode in series in a path between said means for extracting and said detector;
   B. a second PIN diode in shunt across a path between said first PIN diode and said means for extracting;
   C. a third PIN diode in shunt across a path between said first PIN diode and said detector; and
   D. means for alternately and periodically reverse-and-forward biasing said first PIN diode while forward-and-reverse-biasing said second and third PIN diodes.

4. An amplifying circuit as in claim 1 wherein said modulating signal comprises a square wave.

5. An amplifying circuit as in claim 1 wherein said modulating signal comprises a stepped wave.

6. An amplifying circuit as in claim 1 wherein said detector comprises:
   A. a diode connected to rectify said modulated signal and generate a rectified signal; and
   B. means for filtering connected to filter the rectified signal.

7. An amplifying circuit as in claim 6 wherein said circuit includes means for forward biasing said diode.

8. A controllable gain amplifying circuit, said circuit comprising:
   A. a gain-controllable amplifier adapted for reception of an input signal and a control signal, said gain-controllable amplifier for amplifying said input signal to generate an output signal;
   B. means for extracting a portion of said output signal;
   C. means for amplitude modulating said extracted portion with a modulation signal to generate a modulated signal;
   D. a detector connected to produce a variable voltage or current from the modulated signal and thereby recover the modulation signal therefrom;
   E. a second amplifier connected to amplify the recovered modulation signal;
   F. means for comparing the amplitude of the amplified recovered modulation signal with a reference to generate an error signal; and
   G. means for controlling the gain of said gain-controllable amplifier in response to said error signal.

9. An amplifying circuit as in claim 1 wherein said means for comparing the amplitude of the recovered modulation signal comprises:
   A. a synchronous rectifier comprising:
      1. a first gate connected to receive the recovered modulation signal, said first gate being enabled by a first portion of said modulating signal to pass said recovered modulation signal;
      2. a first capacitor connected to filter the signal passed by said first gate;
      3. a second gate connected to receive the recovered modulation signal, said second gate being enabled by a second portion of said modulating signal to pass said recovered modulation signal, said second portion being substantially opposite in phase to said first portion;
      4. a second capacitor connected to filter the signal passed by said second gate; and
      5. a third amplifier having first and second input terminals and an output terminal, said first input terminal connected to receive the filtered signal from said first capacitor, said second input terminal connected to receive the filtered signal from said second capacitor, said output terminal thereby supplying said error signal to said gain-controllable amplifier; and
   B. a reference voltage supply means connected to supply a reference voltage to said second input terminal of said third amplifier.

10. An amplifying circuit as in claim 8 wherein said means for amplitude modulating comprises a switch.

11. An amplifying circuit as in claim 10 wherein said switch comprises:
    A. a first PIN diode in series in a path between said means for extracting and said detector;
    B. a second PIN diode in shunt across a path between said first PIN diode and said means for extracting;
    C. a third PIN diode in shunt across a path between said first PIN diode and said detector; and
    D. means for alternately and periodically reverse-and-forward biasing said first PIN diode while forward-and-reverse-biasing said second and third PIN diodes.

12. An amplifying circuit as in claim 8 wherein said modulating signal comprises a square wave.

13. An amplifying circuit as in claim 8 wherein said modulating signal comprises a stepped wave.

14. Am amplifying circuit as in claim 8 wherein said detector comprises:
    A. a diode connected to rectify said modulated signal and generate a rectified signal; and
    B. means for filtering connected to filter the rectified signal.

15. An amplifying circuit as in claim 14 wherein said circuit includes means for forward biasing said diode.

16. A method for controlling a gain-controllable amplifier, said gain-controllable amplifier having a first input for receiving a signal to be amplified, a second input for receiving a gain control signal, and an output for producing an amplified signal, said method comprising the steps of:
    (1) extracting a portion of said amplified signal;

(2) amplitude modulating said extracted portion with a modulation signal to produce a modulated signal;
(3) recovering the modulation signal from the modulated signal;
(4) comparing the amplitude of the recovered modulation signal with a reference to generate an error signal; and
(5) using said signal to generate said gain control signal.

17. A method as in claim 16 wherein a switch is used for amplitude modulating the extracted portion of said amplified signal.

18. A method as in claim 16 wherein the recovered modulation signal is amplified prior to comparison with the reference.

19. A circuit for controlling the gain of a gain-controllable amplifier, said amplifier having a first input for receiving a signal to be amplified, a second input for receiving a gain control signal, and an output for producing an amplified signal, said circuit comprising:
means for extracting a portion of said amplified signal, said means for extracting being connected to receive said amplified signal;
means for amplitude modulating said extracted portion with a modulation signal to produce a modulated signal, said means for amplitude modulating coupled to said means for extracting;
means for recovering the modulation signal from the modulated signal, said means for recovering coupled to said means for amplitude modulating;
means for comparing the amplitude of the recovered modulation signal with a reference to generate an error signal, said means for comparing coupled to said means for recovering; and
means for using said error signal to generate said gain control signal, said means for using coupled to said means for comparing and to said second input.

20. A circuit as in claim 19 wherein said means for amplitude modulating comprises a switch.

21. A circuit as in claim 20 wherein said switch comprises:
A. a first PIN diode in series in a path between said means for extracting and said means for recovering;
B. a second PIN diode in shunt across a path between said first PIN diode and said means for extracting;
C. a third PIN diode in shunt across a path between said first PIN diode and said means for recovering; and
D. means for alternately and periodically reverse-and-forward biasing said first PIN diode while forward-and-reverse-biasing said second and third PIN diodes.

22. A circuit as in claim 19 wherein said means for recovering comprises:
A. a diode connected to rectify said modulated signal and generate a rectified signal; and
B. means for filtering connected to filter the rectified signal.

23. A circuit as in claim 22 wherein said circuit includes means for forward biasing said diode.

* * * * *